(12) United States Patent
Rodder

(10) Patent No.: US 6,329,225 B1
(45) Date of Patent: Dec. 11, 2001

(54) TIGHT PITCH GATE DEVICES WITH ENLARGED CONTACT AREAS FOR DEEP SOURCE AND DRAIN TERMINALS AND METHOD

(75) Inventor: Mark S. Rodder, University Park, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/438,053

(22) Filed: Nov. 10, 1999

Related U.S. Application Data

(60) Provisional application No. 60/107,800, filed on Nov. 10, 1998.

(51) Int. Cl.$^7$ .................................................... H01L 29/72
(52) U.S. Cl. ...................... 438/151; 438/230; 438/265; 438/299; 438/303; 438/514; 257/327; 257/335; 257/336
(58) Field of Search ..................................... 257/327, 335, 257/336; 438/151, 230, 265, 299, 303, 514

(56) References Cited

U.S. PATENT DOCUMENTS 6,144,065 * 11/2000 Kinzer .................................. 257/327

OTHER PUBLICATIONS

"Raised Source/Drain MOSFET with Dual Sidewall Spacers," by Mark Rodder, D. Yeakley, IEEE Electron Device Letters, vol. 12, No. 3, Mar. 1991.

* cited by examiner

*Primary Examiner*—Edward Wojciechowicz
(74) *Attorney, Agent, or Firm*—Carlton H. Hoel; W. James Brady; Frederick J. Telecky, Jr.

(57) ABSTRACT

An enlarged contact area (62, 162) is formed for a gate structure (14, 114) by providing a substrate (12, 112) having at least one gate electrode (22, 122) thereon. An implant sidewall (42, 142) is formed outwardly from the gate electrode (22, 122) and defines an implant area (44, 144) in the substrate (12, 112). A terminal (50, 150) is formed for the gate electrode (22, 122) by implanting dopants (46, 146) into the implant area (44, 144) in the substrate (12, 112). The implant sidewall (42, 142) is removed and an insulative sidewall (60, 160) is formed outwardly from the gate electrode (22, 122). The insulative sidewall (60, 160) has a thickness less than that of the implant sidewall (42, 142) to define an enlarged contact area (62, 162) for the terminal (50, 150).

4 Claims, 4 Drawing Sheets

TIGHT PITCH GATE DEVICES WITH ENLARGED CONTACT AREAS FOR DEEP SOURCE AND DRAIN TERMINALS AND METHOD

This application claims benefit of Prov. No. 60/107,800 filed Nov. 10, 1998.

TECHNICAL FIELD OF THE INVENTION

This invention relates generally to the field of integrated circuits, and more particularly to tight pitch gate devices with enlarged contact areas for deep source and drain terminals and a method for forming the same.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors, and other semiconductor devices. Typically, such devices are formed in and on a substrate and are interconnected to form an integrated circuit. One type of transistor is the metal oxide semiconductor field effect transistor (MOSFET) in which current flows through a narrow conductive channel between a source and drain and is modulated by an electric field applied at the gate electrode. In tight pitch gate applications such as memory arrays, for example, MOSFETs may be packed within 2,000–3,000 angstroms of one another.

A MOSFET is typically fabricated by forming the gate electrode outwardly of a substrate. Dopants are implanted and diffused into the substrate on either side of the gate electrode to form the source and drain as well as pockets and extensions for the source and drain. Contacts connect each of the gate electrode, source, and drain to other components of the integrated circuit.

To minimize short channel effects that degrade device performance, the source and drain are spaced apart from the conductive channel underlying the gate electrode. This is generally accomplished during fabrication by enlarging the sidewall insulator formed along the gate electrode to act as a spacer and prevent source and drain dopant implant in the substrate next to the gate. For tight pitch applications having small device size, however, the enlarged sidewall spacer takes up a large fraction of the area between the adjacent gate electrodes. As a result, contact areas for the source and drains are reduced and device yield is decreased.

SUMMARY OF THE INVENTION

In accordance with the present invention, tight pitch gate devices with enlarged contact areas for source and drain terminals and method are provided that substantially eliminate or reduce disadvantages and problems associated with previously developed systems and methods. In particular, the present invention provides implant sidewalls that limit dopant implant area during source and drain formation and that are later removed to enlarge contact areas for the source and drain.

In one embodiment of the present invention, an enlarged contact area is formed for a gate device by providing a substrate having thereon at least one gate electrode. An implant sidewall is formed outwardly from the gate electrode and defines an implant area in the substrate. A terminal is formed for the gate electrode by implanting dopants into the implant area in the substrate. The implant sidewall is removed and an insulative sidewall is formed outwardly from the gate electrode. The insulative sidewall has a thickness less than that of the implant sidewall to define an enlarged contact area for the terminal.

Technical advantages of the present invention include providing enlarged contact areas between gate devices in memory arrays and other tight pitch applications. In particular, the contact area for the terminal is enlarged without adverse effect upon terminal spacing from the gate electrodes. This is accomplished by a removable implant sidewall that is used to limit dopant implant area during source and drain formation and thereafter removed to leave a contact area larger than the implant area. The enlarged contact area allows for better connections between the source and drains of the gate devices and other components of the integrated circuit. Accordingly, device yield is increased.

Other technical advantages will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings in which.

DETAILED DESCRIPTION OF THE INVENTION

FIGS. 1A–F illustrate fabrication of tight pitch gate devices for an integrated circuit in accordance with one embodiment of the present invention. In this embodiment, the gate devices are metal oxide semiconductor field effect transistors (MOSFETs) of a deep submicron gate length and the integrated circuit is a static random access memory (SRAM). It will be understood that the present invention may be used to fabricate other types of gate devices for other types of suitable memory arrays and integrated circuits.

Figure 1A:
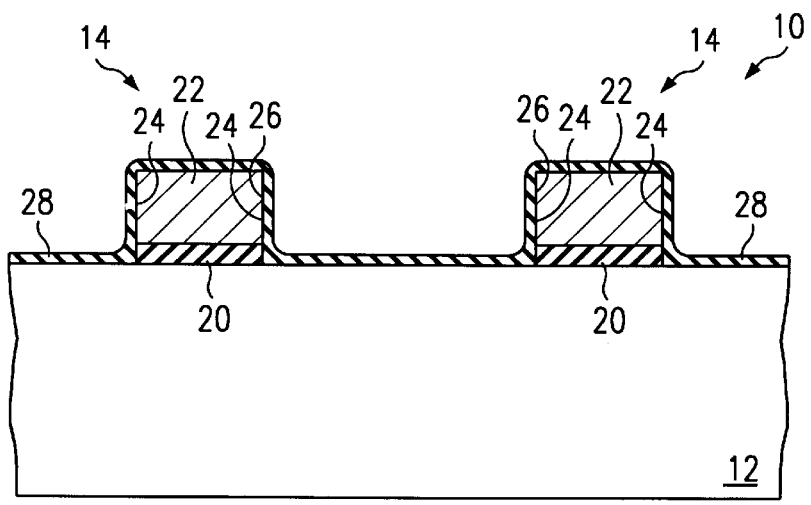
FIGS. 1A–F are a series of schematic cross-sectional diagrams illustrating fabrication of tight pitch gate devices having an enlarged contact area in accordance with one embodiment of the present invention.

Referring to FIG. 1A, an initial structure 10 for the SRAM includes a substrate 12 having a plurality of MOSFET gate structures 14 extending from the substrate 12 and spaced apart from each other. For the SRAM embodiment and other tight pitch applications, the gate structures 14 are spaced apart by a distance less than or equal to about 2,000 angstroms. The tight pitch allows for high device density in the SRAM, and thus small SRAM size.

The substrate 12 comprises a semiconductor material such as single-crystalline silicon. The substrate 12 is a semiconductor wafer, an epitaxial layer grown on a wafer, a semiconductor on insulation (SOI) system or other suitable structure. The substrate 12 may include previously formed active devices (not shown) such as transistors, capacitors, resistors and the like. Accordingly, the gate devices may be constructed in the midst of other active devices as long as the gate devices are suitably isolated from the other devices.

The gate structures 14 each include a gate dielectric 20 formed outwardly of the substrate 12 and a gate electrode 22 formed outwardly of the gate dielectric 20. The gate dielectrics 20 comprise oxide or other suitable insulative material. The gate electrodes 22 include sides 24 with opposing sides 26 facing each other. The gate electrodes 22 comprise polycrystalline silicon or other suitable conductive material.

The gate structures 14 are conventionally formed by depositing, patterning, and etching insulative and conductive layers. After formation of the gate structures 14, a thin reoxidation layer 28 is formed outwardly of the substrate 12 and gate structures 14. The reoxidation layer 28, if necessary, repairs gate etch damage to the gate dielectrics 20. For the exemplary SRAM embodiment, the gate dielectrics 20 comprise oxide having a thickness of about 30–50 angstroms, the gate electrodes 22 comprise polysilicon having a thickness of about 2,000–3,000 angstroms, and the reoxidation layer 28 comprises oxide having a thickness of about 100 angstroms.

Figure 1B:
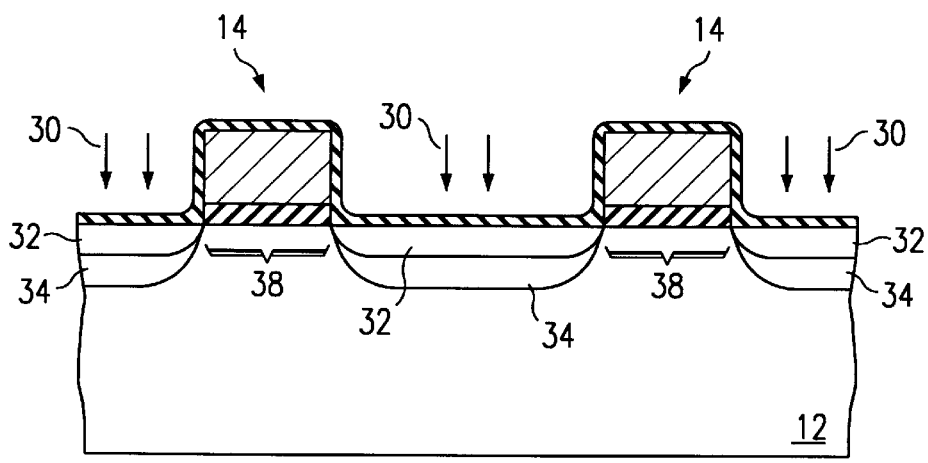

Referring to FIG. 1B, dopants 30 are implanted into the substrate 12 between the gate structures 14 to form source and drain extensions 32 and pockets 34 for the MOSFET devices. The extensions 32 extend later formed source and drains to compensate for short channels of the devices. For example, in nMOSFETs, the extensions 32 are n-type formed by implanting As dopants with a peak concentration of about $5E19/CM^3$ and a depth of about 600 angstroms. The pockets 34 are used in connection with the extensions 32 to reduce gate length sensitivity to drive current. The pockets 34 are formed by implanting opposite-type dopants to a concentration of about $4E17/CM^3$ at a depth greater than the drain extension. A channel 28 underlies the gate electrode 22 between the extensions and pockets 32 and 34 in the substrate 12.

Figure 1C:
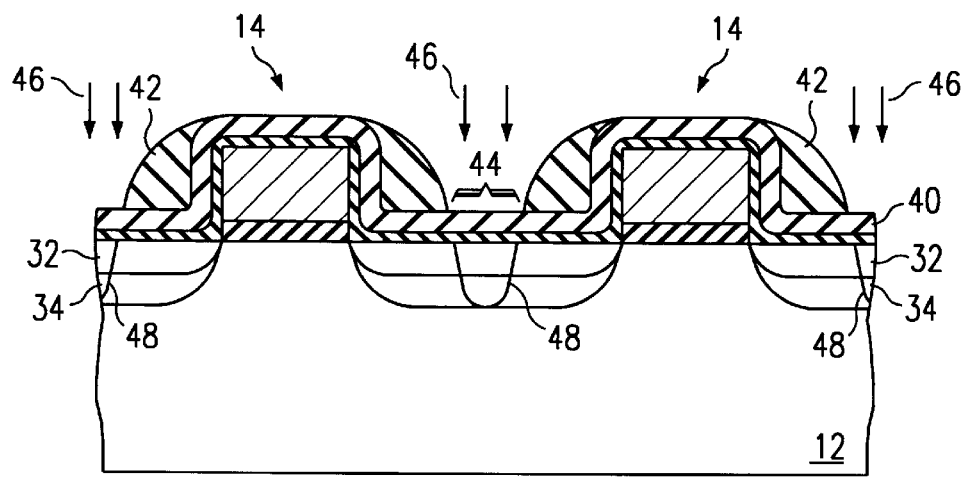

Referring to FIG. 1C, a protective layer 40 is formed outwardly of the substrate 12 and gate structures 14. As described in more detail below, the protective layer 40 allows implant sidewalls to be formed and removed and insulative sidewalls to be formed partially in the place of the implant sidewalls without damage to the underlying substrate 12 and gate structures 14. Accordingly, the protective layer 40 comprises a material from which the material of the implant sidewalls may be selectively removed by etch or other suitable process. The material of the protective layer 40 should also be a dielectric material that will act as an insulator for the gate structures 14 and thus not need to be later removed.

The implant sidewalls 42 are formed outwardly of the protective layer 40 along the sides 24 of the gate electrodes 22. The implant sidewalls 42 formed along opposing sides 26 of the gate electrodes 22 define a limited implant area 44 between the gate structures 14 for implantation of source and drain dopants. By limiting the implant area 44, the implant sidewalls 42 allow source and drain dopants to be implanted and deeply diffused into the substrate 12 without entering the channels 38 and degrading device performance. The resulting deep source and drain reduce junction capacitance, diode leakage, and resistance for the devices.

For the exemplary SRAM embodiment having a spacing of 2,000 angstroms between the MOSFET devices, the dopant implant area 44 is approximately 500 angstroms wide between the gate structures 14. In this embodiment, the protective layer 40 has a thickness of about 100–150 angstroms and the implant sidewalls 42 each have a base thickness of about 500–550 angstroms. As previously discussed, the reoxidation layer 28 has a thickness of about 100 angstroms. The size and thickness of the protective layer 40 and implant sidewalls 42, as well as other elements, may be adjusted to control the size of the dopant implant area 44.

As previously described, the material of the implant sidewalls 42 should be selectively removable to the material of the underlying protective layer 40 to allow the implant sidewalls 42 to be removed without damage to the underlying substrate 12 and gate structures 14. In one embodiment, the protective layer 40 comprises oxide and the implant sidewalls 42 comprise nitride that is selectively etchable from the oxide. In this embodiment, the protective layer 40 is formed by conventionally depositing oxide and the implant sidewalls 42 are conventionally formed by depositing and anisotropically etching a nitride layer outwardly of the oxide layer. The protective layer 40 and implant sidewalls 42 may comprise other suitable materials that are selectively etchable or otherwise removable from each other. For example, the protective layer 40 may comprise nitride and the implant sidewalls 42 comprise oxide.

Source and drain dopants 46 are implanted into the substrate 12 between the implant sidewalls 42 to form source and drain implant regions 48. As described in more detail below, dopants 46 are diffused from the implant regions 48 to form a source and a drain for the MOSFET devices. For the exemplary SRAM embodiment, in nMOSFETs for example, the source and drain implant regions 48 are formed by implanting As dopants to a concentration of about $1E20/CM^3$ to a depth of about 1,500 angstroms.

Figure 1D:
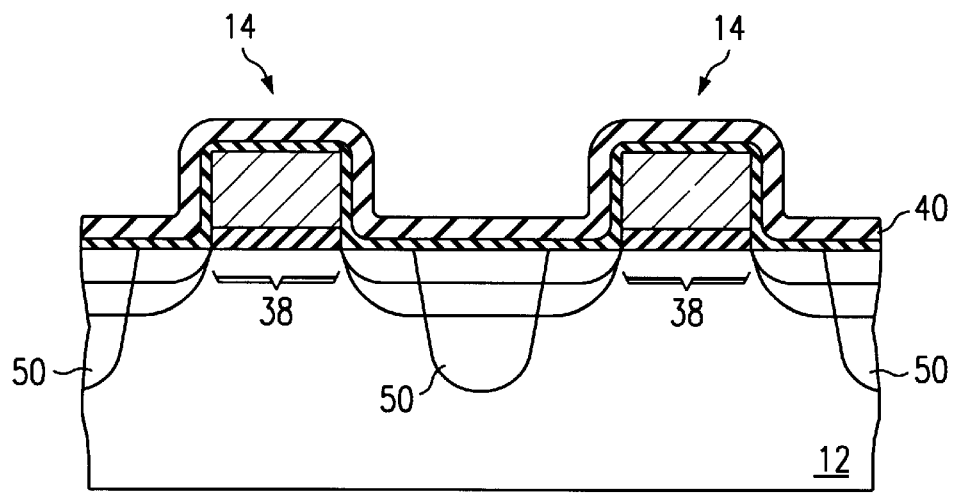

Referring to FIG. 1D, the source and drain dopants 46 are diffused into the substrate 12 from the implant area 48 to form a deep source, drain, or other terminal 50 for the devices. The terminal 50 may be any type of suitable electrode or other element for one or more of the devices. The deep source/drain 50 reduces junction capacitance, diode leakage, and resistance of the MOSFET devices.

The source and drain dopants 46 are diffused from the implant area 48 into the substrate 12 by a rapid thermal anneal (RTA) or other suitable process. For the exemplary SRAM embodiment, the RTA has a temperature greater than about 950 degrees Celsius and a duration greater than about five (5) seconds. In addition to diffusing the source and drain dopants 46, the RTA may densify oxide of the underlying reoxidation layer 28 and protective layer 40.

The implant sidewalls 42 are removed. Accordingly, contact area for the source/drain 50 is not limited by the size of the implant sidewalls 42 or the dopant implant area 44 defined between the implant sidewalls 42. The implant sidewalls 42 are removed by a conventional hot phosphoric or other suitable etch that selectively removes the implant sidewalls 42 from the underlying protective layer 40. The implant sidewalls 42 may be removed before or after the RTA or other diffusion process.

Figure 1E:
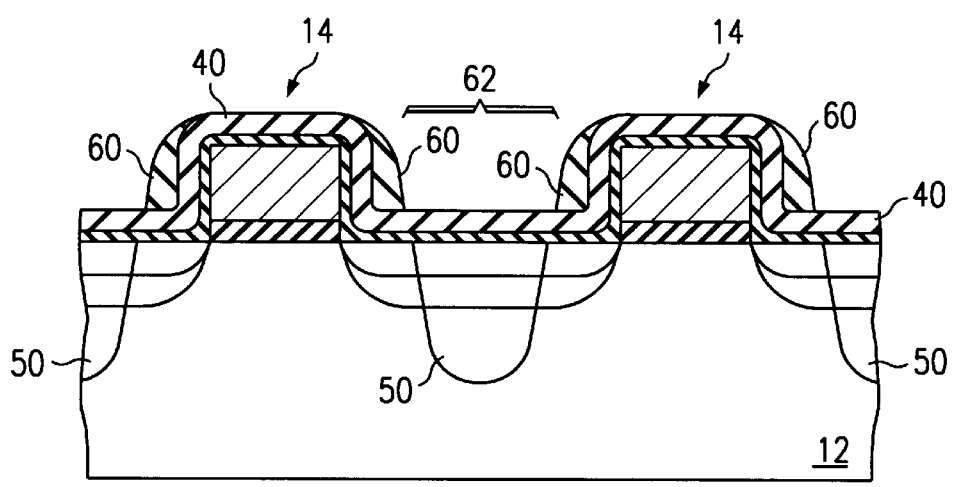
Figure 1F:
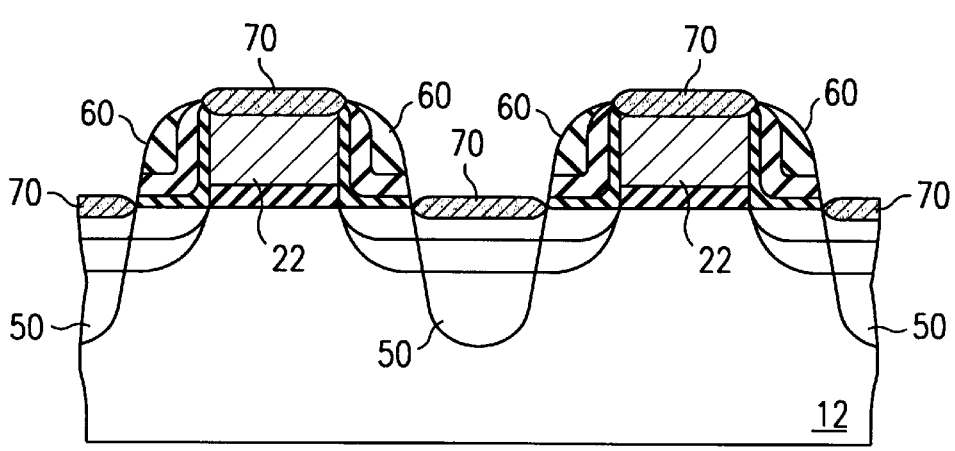

Referring to FIG. 1E, insulative sidewalls 60 are formed outwardly of the protective layer 40 along sides 24 of the gate electrodes 22. The insulative sidewalls 60 have a thickness less than that of the implant sidewalls 42 to define an enlarged contact area 62 between the gate structures 14 for the source/drain 50. The contact area 62 is enlarged in that it is larger than the source/drain implant area 44.

The insulative sidewalls 60 comprise nitride or other dielectric material capable of insulating the gate electrodes 22. The insulative sidewalls 60 are conventionally formed by depositing and anisotropically etching a dielectric layer outwardly of the protective layer 40. Thus, the insulative sidewalls 60 are formed partially within the space from which the implant sidewalls 42 were removed. For the exemplary SRAM embodiment, the enlarged contact area 62 is about 1,200 angstroms. In this embodiment, the insulative sidewalls 60 each have a thickness of about 250 angstroms.

Referring to iF, portions of the protective layer 40 and reoxidation layer 28 covering the gate electrodes 22 and the source/drain 50 that are removed by a suitable etch and the exposed areas salicided to form a low resistance contact interface 70 with the gate electrodes 22 and the source/drain 50. During the salicidation process, the insulative sidewalls 60 protect the source and drain extensions 32 from salicidation. Contacts (not shown) may then be formed for the gate electrodes 22 and the source/drain 50. The contact for the source/drain 50 is enlarged in accordance with the enlarged contact area 62 and thus allows for better connection between the source/drain 50 and other devices of the integrated circuit. Integrated circuit yield is correspondingly increased.

FIGS. 2A–E illustrate fabrication of tight pitch gate devices for an integrated circuit in accordance with another embodiment of the present invention. In this embodiment, the gate devices are also MOSFETs of a deep submicron gate length and the integrated circuit an SRAM. It will be understood that this embodiment of the present invention may also be used to fabricate other types of gate devices for other types of suitable memory arrays and integrated circuits.

Figure 2A:
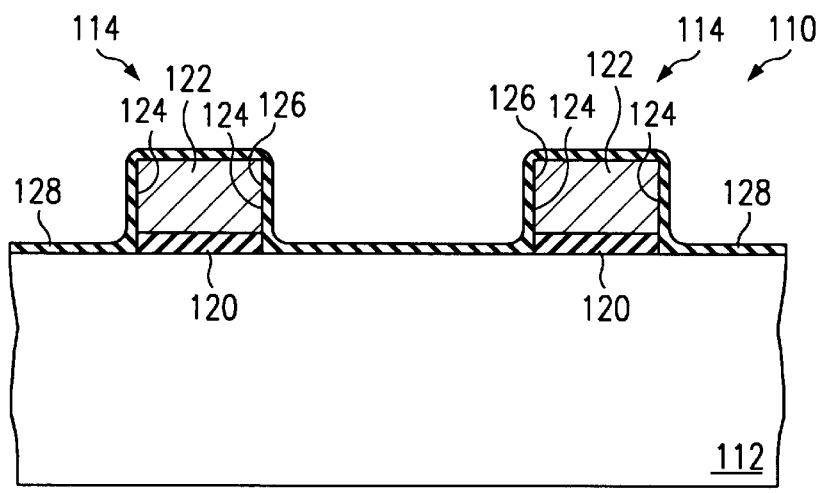
FIGS. 2A–E are a series of schematic cross-sectional diagrams illustrating fabrication of tight pitch gate devices having an enlarged contact area in accordance with another embodiment of the present invention.

Referring to FIG. 2A, an initial structure 110 for the SRAM includes a substrate 112 having a plurality of gate structures 114 extending from the substrate 112 and spaced apart from each other as previously described in connection with substrate 12 and gate structures 14. The gate structures 114 are spaced apart by a distance less than or equal to about 2,000 angstroms to allow for high device density in the SRAM.

The gate structures 114 each include a gate dielectric 120 formed outwardly of the substrate 112 and a gate electrode 122 formed outwardly of the gate dielectric 120 as previously described in connection with gate dielectric 20 and gate electrode 22. The gate electrodes 122 include sides 124 with opposing sides 126 facing each other. A thin reoxidation layer 128 is formed outwardly of the substrate 112 and the gate structures 114 as previously described for the thin reoxidation layer 28.

For the exemplary SRAM embodiment of FIGS. 2A–E in which the gate structures 114 are spaced apart by a distance less than or equal to about 2,000 angstroms, the gate dielectrics 120 comprise oxide having a thickness of about 30–50 angstroms, the gate electrodes 122 comprise polysilicon having a thickness of about 2,000–3,000 angstroms and the reoxidation layer 128 comprises oxide having a thickness of about 100 angstroms.

Figure 2B:
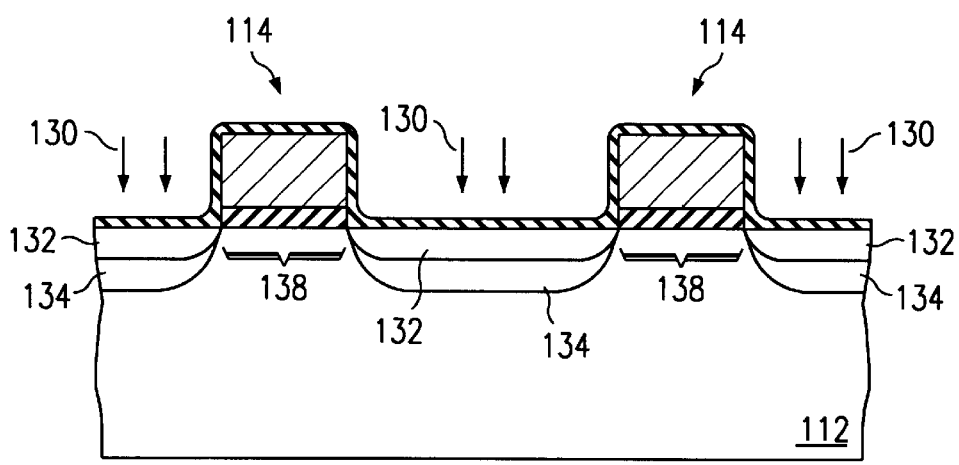

Referring to FIG. 2B, dopants 130 are implanted into the substrate 112 between the gate structures 114 to form source and drain extensions 132 and pockets 134 for the MOSFET devices as previously described for the source and drain extensions 32 and pockets 34. A channel 138 underlies the gate electrode 122 between the extensions 132 and pockets 134 in the substrate 112.

Figure 2C:
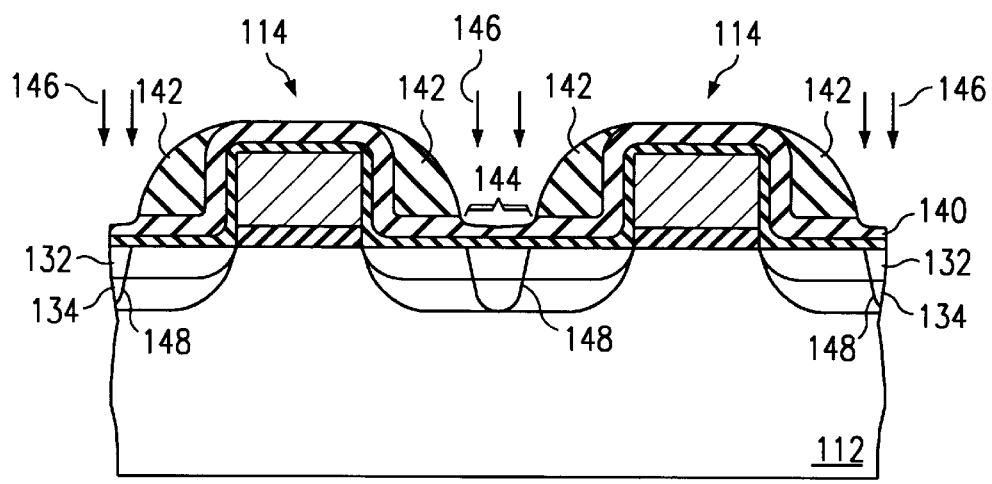

Referring to FIG. 2C, a protective layer 140 is formed outwardly of the substrate 112 and the gate structures 114. As described in more detail below, the protective layer 140 is later etched to form insulative sidewalls for the gate structures 114. Thus, the protective layer 140 is a dielectric material. In addition, the protective layer 140 allows implant sidewalls to be formed and removed without damage to the underlying substrate 112 and gate structures 114. Accordingly, the protective layer 140 comprises a material from which the implant sidewalls may be selectively removed by etch or other suitable process.

The implant sidewalls 142 are formed outwardly of the protective layer 140 along the sides 124 of the gate electrodes 122. The implant sidewalls 142 formed along opposing sides 126 of the gate electrodes 122 define a limited implant area 144 for implantation of source and drain dopants. By limiting the implant area 144, the implant sidewalls 142 allow source and drain dopants to be implanted and deeply diffused into the substrate 112 without entering the channels 138 and degrading device performance. The resulting deep source and drain reduce junction capacitance, diode leakage, and resistance for the devices.

For the exemplary SRAM embodiment having a spacing of 2,000 angstroms between the MOSFET devices, the dopant implant area 144 is approximately 600 angstroms wide between the gate structures 114. In this embodiment, the protective layer 140 has a thickness of about 200–300 angstroms and the implant sidewalls 142 each have a base thickness of about 350–450 angstroms. The reoxidation layer 128 has a thickness of about 100 angstroms. The size and thickness of the protective layer 140 and the implant sidewalls 142, as well as other elements, may be adjusted to control the size of the dopant implant area 144.

As previously described, the material of the implant sidewalls 142 should be selectively removable to the material of the underlying protective layer 140 to allow the implant sidewalls 142 to be removed without damage to the underlying substrate 112 and the gate structures 114. In one embodiment, the protective layer 140 comprises nitride and the implant sidewalls 142 comprise deposited oxide (TEOS), phosphorous silicate glass (PSG), or doped oxide. In this embodiment, the protective layer 140 is conventionally deposited and the implant sidewalls 142 are formed by conventional deposition and anisotropic etch process. During the etch, some nitride from the protective layer may be removed over the implant area 144 to control the final screen thickness of the protective layer before source and drain implant. The post etch thickness of the protective layer 140 over the implant area 144 may be 100–200 angstroms.

Source and drain dopants 146 are implanted into the substrate 112 between the implant sidewalls 142 to form source and drain implant regions 148. As described in more detail below, dopants 146 are diffused from the implant regions 148 to form a source, drain, or other terminal for the MOSFET devices. For the exemplary SRAM embodiment, in nMOSFETs for example, the source and drain implant regions 148 are formed by implanting As dopants to a concentration of about $1E20/CM^3$ to a depth of about 1,500 angstroms.

Figure 2D:
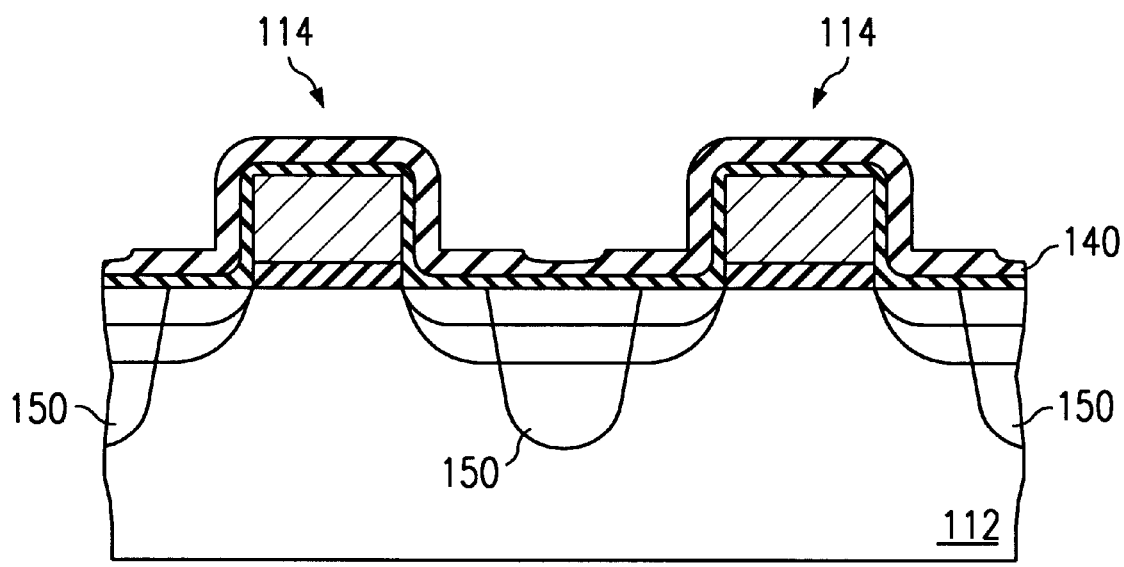

Referring to FIG. 2D, the source and drain dopants 146 are diffused into the substrate 112 from the implant area 148 to form a deep source, drain, or other terminal 150 for the device. As previously described in connection with the terminal 50, the terminal 150 may be any type of suitable electrode or other element for one or more of the devices. The deep source/drain 150 reduces junction capacitance, diode leakage, and resistance of the MOSFET devices.

The source and drain dopants 146 are diffused from the implant area 148 into the substrate 112 by an RTA or other suitable process. For the exemplary SRAM embodiment, the RTA has a temperature of greater than about 950 degrees Celsius and a duration greater than about five (5) seconds. In addition to diffusing the source and drain dopants 146, the RTA may densify the underlying reoxidation layer 128 and protective layer 140.

The implant sidewalls 142 are removed. Accordingly, contact area for the source/drain 150 is not limited by the size of the implant sidewalls 142 or the dopant implant area 144 defined between the implant sidewalls 142. The implant sidewalls 142 are removed by conventional etch or other suitable process that selectively removes the implant sidewalls 142 from the underlying protective layer 140. The implant sidewalls 142 may be removed before or after the RTA or other diffusion process.

Figure 2E:
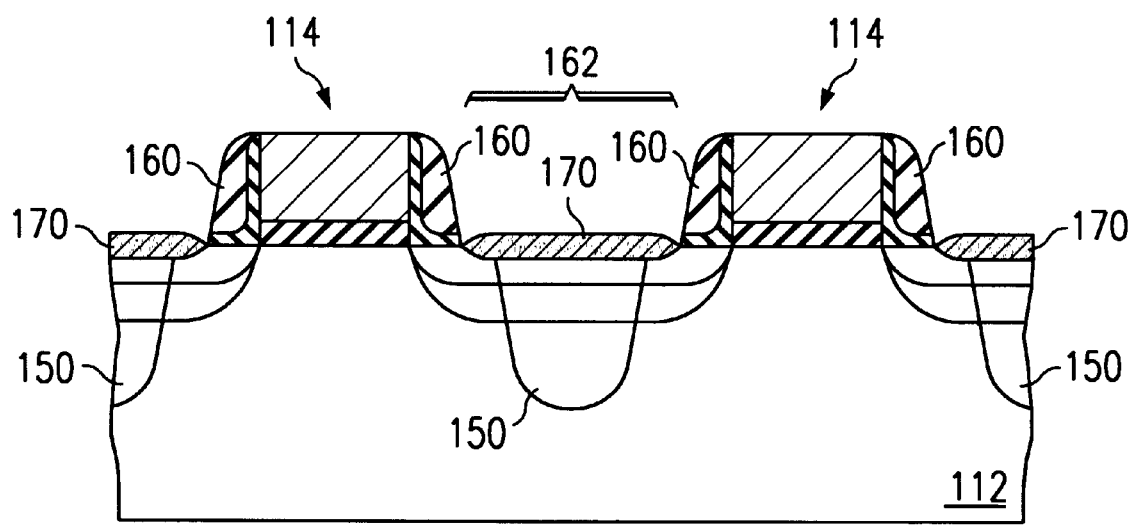

Referring to FIG. 2E, insulative sidewalls 160 are formed along sides 124 of the gate electrodes 122 by etching the protective layer 140 with a conventional anisotropic etch. Thus, the implant sidewalls 142 are removed to leave the insulative sidewalls 160 in that the insulative sidewalls are formed from the layer underlying the implant sidewalls 142. Accordingly, the insulative sidewalls 160 have a thickness less than that of the implant sidewalls 142 to define an enlarged contact area 162 between the gate structures 114 for the source/drain 150. The contact area 162 is enlarged in that it is larger than the source/drain implant area 144. For the exemplary SRAM embodiment, the enlarged contact area 162 is about 1,200 angstroms. In this embodiment, the insulative sidewalls 60 each have a thickness of about 250 angstroms.

Portions of the protective layer 140 and the reoxidation layer 28 covering the gate electrodes 122 and the source/drain 150 are removed during the formation of the insulative sidewalls 160 by the anisotropic etch. These exposed areas may be salicided to form a low resistance contact interface 170 with the gate electrodes 122 and the source/drain 150. During the salicidation process, the insulative sidewalls 160 protect the source and drain extensions 132 from salicidation. Contacts (not shown) may then be formed for the gate electrodes 122 and the source/drain 150. The contact for the source/drain 150 is enlarged in accordance with the enlarged contact area 162 and thus allows for better connection between the source/drain 150 and other devices of the integrated circuit. The integrated circuit is correspondingly increased.

Although the present invention has been described with several embodiments, various changes and modifications may be suggested to one skilled in the art. It is intended that the present invention encompass such changes and modifications as fall within the scope of the appended claims.

What is claimed is:

1. A method of forming a contact in an integrated circuit, comprising the steps of:

(a) forming first and second insulated gates on a substrate;

(b) implanting a first dose of dopants into said substrate between said first and second gates using said first and second gates as at least a part of the implant mask;

(c) forming a first sidewall spacer on said first gate and adjacent said second gate;

(d) forming a second sidewall spacer on said second gate and adjacent said first gate;

(e) implanting a second dose of dopants into said substrate between said first and second gates using said first and second gates plus said first and second sidewall spacers as at least a part of the implant mask;

(f) removing both said first and second sidewall spacers; and (g) forming a contact to said substrate between said first and second gates.

2. The method of claim 1, further comprising the step of:

(a) after step (f) of claim 1 and prior to step (g) of claim 1, forming a third sidewall spacer on said first gate and adjacent said second gate and forming a fourth sidewall spacer on said second gate and adjacent said first gate, whereby said contact is between said third and fourth sidewall spacers.

3. The method of claim 1, wherein:

(a) said first and second gates each includes a conformal dielectric layer on a conductive gate.

4. An integrated circuit, comprising:

(a) first and second insulated gates on a substrate;

(b) a first region of dopants in said substrate between said first and second gates and aligned with said first and second gates;

(c) a second region of dopants in said substrate between said first and second gates, overlapping said first region of dopants, and aligned to a first distance from each of said first and second gates; and (d) a contact to said substrate between said first and second gates and aligned to a second distance from each of said gates, said second distance smaller than said first distance.

\* \* \* \* \*